United States Patent [19]

Goll

[11] Patent Number: 4,494,091

[45] Date of Patent: Jan. 15, 1985

[54] DAMPING PACKAGE FOR SURFACE ACOUSTIC WAVE DEVICES

[75] Inventor: Jeffrey H. Goll, Dallas, Tex.

[73] Assignee: The United States of America as represented by the Secretary of the Army, Washington, D.C.

[21] Appl. No.: 492,517

[22] Filed: May 9, 1983

[51] Int. Cl.³ .................. H03H 9/25; H03H 9/42; H03H 9/64
[52] U.S. Cl. .................. 333/151; 310/313 R; 333/194
[58] Field of Search .................. 333/150–155, 333/193–196, 141–145; 310/313 R, 313 A, 313 B, 313 C, 313 D

[56] References Cited

U.S. PATENT DOCUMENTS

| 2,859,415 | 11/1958 | Fagen | 333/143 |
| 4,234,859 | 11/1980 | Ikushima et al. | 333/151 |
| 4,364,017 | 12/1982 | Tokunaga et al. | 333/151 X |

Primary Examiner—Marvin L. Nussbaum
Attorney, Agent, or Firm—Anthony T. Lane; Jeremiah G. Murray; Robert A. Maikis

[57] ABSTRACT

A surface acoustic wave (SAW) device is fabricated to minimize or eliminate spurious signals caused by bulk modes. A backing layer is provided on the bottom surface of the crystal substrate of the SAW device having an acoustic impedance nearly the same as that of the crystal substrate for a family of spurious bulk modes.

8 Claims, 3 Drawing Figures

4,494,091

DAMPING PACKAGE FOR SURFACE ACOUSTIC WAVE DEVICES

The Government has rights in this invention pursuant to Contract No. DAAB-07-78-C-0172 awarded by the Department of the Army.

BACKGROUND OF THE INVENTION

1. Field of the Invention

This invention relates generally to surface acoustic wave (SAW) devices, and more particularly to the elimination or minimization of bulk waves in such devices.

2. Description of the Prior Art

Surface acoustic wave devices, including convolvers and filters, may have bulk modes induced in addition to the desired surface wave. Such bulk modes produce spurious responses which denigrate the usefulness of these devices.

Suppression of bulk modes or waves in surface acoustic wave devices has been the object of several prior art structures and methods.

U.S. Pat. No. 3,887,887 of R. S. Wagers et al describes having the bottom or back surface of a SAW device topographically deformed with indentations, protrusions, channels, etc. The deformations are preferably randomly spaced because the so-called bulk mode is said to be actually a combination of modes or waves which are coherent. Scattering of these modes by these randomly spaced deformations thereby substantially eliminates the spurious signals which are otherwise produced by the bulk modes.

In the *Proceedings of the Ultrasonics Symposium of 1977*, IEEE Cat. #77CH1264-1SU, an article by A. J. Slobodnik, Jr. et al, entitled low Sidelobe SAW Filters Using Overlap and Withdrawal Weighted Transducers, discloses cutting a deep notch or wedge in the back surface of the substrate crystal.

R. S. Wagers' article in the *Proceedings of the IEEE*, Vol. 64, No. 5, in May, 1976, entitled Spurious Acoustic Responses in SAW Devices, describes backsurface roughening for bulk mode suppression and gives experimental results.

Bulk Wave Generation by the IDT, by R. F. Milsom, published in *Wave Electronics*, 2 (1976) proposes a substrate orientation be used which will minimize bulk waves, and refers to the use of absorbent material on the ends and backface of the substrate, but makes no mention of impedance matching of the absorber.

N. Wakatsuki et al have an article entitled Suppression of Bulk Wave in SAW Filter by Metal Over-Lay Design published in the 1976 *Ultrasonics Symposium Proceedings*, IEEE Cat. #76 CH1120-5SU. Reference is made therein that bulk wave signals radiated at an angle larger than a few degrees to the surface can be attenuated by roughening the bottom surface or applying an acoustic absorber to it.

Acoustic Properties of Tungsten-Vinyl Composites, by S. Lees et al, published in the *IEEE Transactions of Sonics and Ultrasonics*, Vol. SU-20, No. 1, January 1973, describes a method of fabricating materials with controllable characteristics such as specific acoustic impedance for bulk mode tranducers. Vinyl plastic in powdered form and tungsten powder are used.

SUMMARY OF THE INVENTION

The crystal substrate of a surface acoustic wave device is provided with a backing layer on its lower surface. This backing layer is fabricated to have approximately the same acoustic impedance as the substrate for the bulk modes of concern, but is of an acoustically lossy material. Such a backing layer may be fabricated, for example, from tungsten powder and powdered vinyl.

DESCRIPTION OF THE PREFERRED EMBODIMENT

Figure 1:
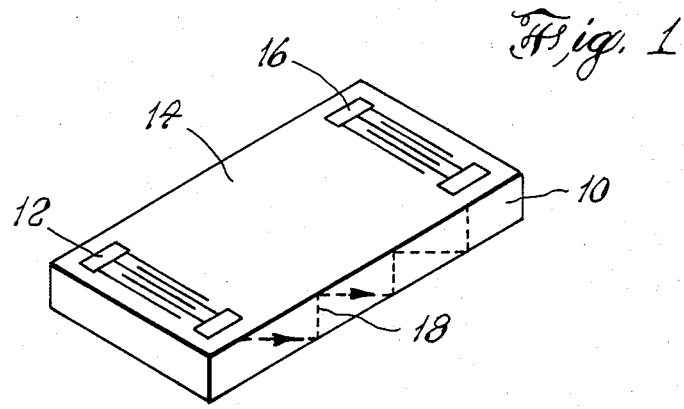
FIG. 1 represents, schematically, a SAW device.

Referring to FIG. 1, SAW (surface acoustic wave) delay line 10 is illustrated. A delay line is used only as an example, since any other SAW device such as convolvers, filters, etc. can also utilize the teaching of the present invention. When SAW delay line 10 is used, a signal applied to interdigital transducer 12 is carried as an acoustic wave along the upper surface 14 to interdigital transducer 16.

As indicated previously, a bulk mode or wave 18 (diagrammatically illustrated as a dashed line) is also induced within the crystal substrate of SAW delay line 10. This bulk wave 18 is reflected one or more times by the bottom surface of the substrate and produces a spurious signal or output at transducer 16.

Figure 2:
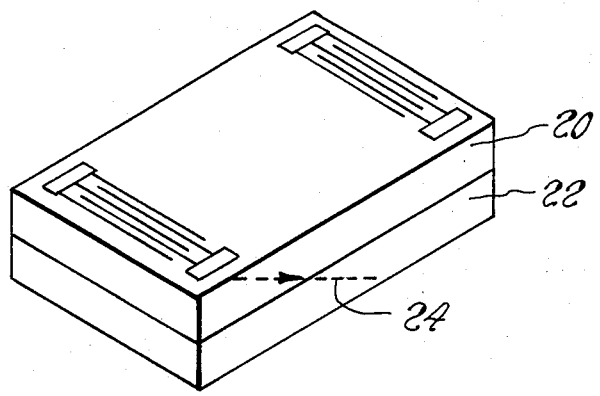
FIG. 2 represents the device of FIG. 1 with an added backing layer on its bottom surface.

Referring now to FIG. 2, SAW delay line 20 is illustrated, which is identical to delay line 10 of FIG. 1 except that (in accordance with the invention) backing layer 22 has been added. Backing layer 22 is fabricated to have nearly the same acoustic impedance as the crystal substrate of SAW delay line 20 for a family of spurious bulk modes. Since there is little or no change in acoustic impedance at the interface between the lower surface of the substrate of SAW delay line 20 and backing layer 22, the induced bulk mode 24 (diagrammatically illustrated as a dashed line) is reflected with small or zero amplitude. Backing layer 22 is also fabricated to be an acoustically lossy material so that bulk mode 24 is substantially absorbed therein. Such a lossy material may be made as described in the S. Lees et al article referred to previously using tungsten powder and vinyl powder composites or by other means. For example, polymers such as epoxies might be used together with other metal powders. In essence, a composite is formed of two components having different acoustic impedances, in proportions to yield the desired acoustic impedance. Thus the acoustic impedance of backing layer 22 can be made to be identical, or essentially so, to that of the SAW device for the undesired bulk modes.

The backing layer may be applied to the SAW device while the layer material is not yet cured, or may be affixed to the crystal with an adhesive such as epoxy after curing.

Figure 3:
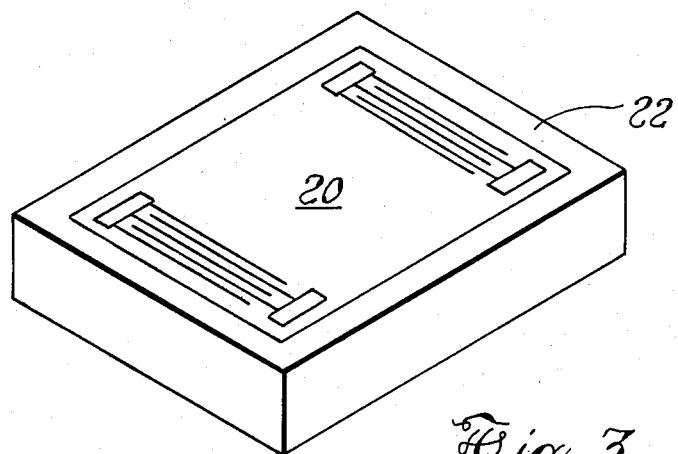
FIG. 3 represents the device of FIG. 2 with added layers along its edges.

Referring now to FIG. 3, the crystal substrate 20 of FIG. 2 is now shown with additional backing material around its edges. This arrangement is intended to eliminate the possibility of reflections of the bulk modes at other surfaces of crystal substrate 20.

The present solution to the problem of spurious signals has the advantage of not requiring additional processing of the crystal substrate material, while it should provide effective reduction of spurious responses especially when the acoustic impedance is carefully matched to the bulk modes of concern.

Although particular embodiments of a damping package for surface acoustic wave devices have been illustrated and described, it will be obvious that changes and modifications can be made without departing from the spirit of the invention or the scope of the appended claims.

I claim:

1. A SAW device having one surface along which acoustic waves are intended to travel and a second surface opposite to said one surface;
   a backing layer on said second surface;
   said backing layer having substantially the same acoustic impedance as the crystal substrate of said SAW device for a family of bulk modes, and
   being fabricated of an acoustically lossy material.

2. A SAW device in accordance with claim 1 wherein:
   said backing layer is a composite of materials having different acoustic impedances.

3. A SAW device in accordance with claim 2 wherein:
   said composite is formed from an epoxy and a metal powder.

4. A SAW device in accordance with claim 2 wherein:
   said composite is formed from vinyl powder and tungsten powder.

5. A SAW device in accordance with claim 1 further including:
   backing material around the edges of said crystal substrate.

6. A SAW device in accordance with claim 5 wherein:
   said backing material is a composite of materials having different acoustic impedances.

7. A SAW device in accordance with claim 6 wherein:
   said composite is formed from an epoxy and a metal powder.

8. A SAW device in accordance with claim 6 wherein:
   said composite is formed from vinyl powder and tungsten powder.

* * * * *